United States Patent
Chao et al.

(10) Patent No.: US 7,388,211 B2
(45) Date of Patent: Jun. 17, 2008

(54) SEMI-CLOSED OBSERVATIONAL ENVIRONMENT FOR ELECTRON MICROSCOPE

(75) Inventors: Chih-Yu Chao, Taipei (TW); Wen-Jiunn Hsieh, Taipei County (TW)

(73) Assignee: Bing-Huan Lee, Kaohsiung County (TW)

( * ) Notice: Subject to any disclaimer, the term of this patent is extended or adjusted under 35 U.S.C. 154(b) by 232 days.

(21) Appl. No.: 11/453,810

(22) Filed: Jun. 16, 2006

(65) Prior Publication Data

US 2007/0145288 A1 Jun. 28, 2007

(30) Foreign Application Priority Data

Dec. 9, 2005 (TW) ............................. 94143727 A

(51) Int. Cl.
*H01J 37/18* (2006.01)
*H01J 37/20* (2006.01)
(52) U.S. Cl. .................. 250/441.11; 250/311; 118/715
(58) Field of Classification Search ........... 250/440.11, 250/311
See application file for complete search history.

(56) References Cited

U.S. PATENT DOCUMENTS

| | | | | |
|---|---|---|---|---|
| 6,454,863 B1* | 9/2002 | Halpin | .......................... | 118/725 |
| 6,582,522 B2* | 6/2003 | Luo et al. | ..................... | 118/715 |
| 6,818,067 B2* | 11/2004 | Doering et al. | ............. | 118/715 |
| 6,911,092 B2* | 6/2005 | Sneh | ........................... | 118/715 |
| 2002/0015855 A1* | 2/2002 | Sajoto et al. | ................ | 428/639 |
| 2004/0025791 A1* | 2/2004 | Chen et al. | ................... | 118/728 |
| 2004/0040664 A1* | 3/2004 | Yang et al. | ............. | 156/345.51 |
| 2004/0206309 A1* | 10/2004 | Bera et al. | ................... | 118/728 |
| 2006/0249677 A1* | 11/2006 | Chao et al. | ................... | 250/311 |
| 2006/0249687 A1* | 11/2006 | Chao et al. | ............. | 250/441.11 |
| 2006/0249688 A1* | 11/2006 | Chao et al. | ............. | 250/441.11 |
| 2006/0261284 A1* | 11/2006 | Chao et al. | ............. | 250/440.11 |
| 2007/0045559 A1* | 3/2007 | Chao et al. | ............. | 250/441.11 |
| 2007/0145268 A1* | 6/2007 | Chao et al. | ................... | 250/310 |
| 2007/0145287 A1* | 6/2007 | Chao et al. | ............. | 250/440.11 |
| 2007/0145289 A1* | 6/2007 | Chao et al. | ............. | 250/440.11 |
| 2008/0073532 A1* | 3/2008 | Chao et al. | ................... | 250/310 |

* cited by examiner

*Primary Examiner*—Nikita Wells
*Assistant Examiner*—Johnnie L Smith, II
(74) *Attorney, Agent, or Firm*—Bacon & Thomas, PLLC

(57) ABSTRACT

A semi-closed observational environment for an electron microscope includes a housing having at least two spacers for partitioning itself into a receiving chamber, a gas chamber below the receiving chamber, a buffer chamber below the gas chamber, at least one gas inlet formed at the gas chamber, and at least one pumping port formed at the buffer chamber. The receiving chamber has at least two view holes formed at top and bottom sides thereof respectively, wherein the latter communicates with the gas chamber. The gas chamber has at least one gas aperture formed at a bottom side thereof for communication with the buffer chamber. The buffer chamber has at least one outer aperture formed at a bottom side thereof for communication with outside. The two view holes of the receiving chamber are coaxially aligned with the gas and outer apertures. A film is mounted to and seals the upper view hole.

14 Claims, 14 Drawing Sheets

SEMI-CLOSED OBSERVATIONAL ENVIRONMENT FOR ELECTRON MICROSCOPE

BACKGROUND OF THE INVENTION

1. Field of the Invention

The present invention relates generally to electron microscopes, and more particularly, to a semi-closed observational environment for an electron microscope.

2. Description of the Related Art

As known in prior art, while a conventional electron microscope is operated to observe an object, the object has to be a nonvolatile solid for further microscopic observation because of the limitation of the vacuum environment of the specimen chamber inside the electron microscope. If the object is volatile, such as liquid, gas, or other fluid, the object will generate a great amount of gas upon after being put into the vacuum specimen chamber, and thus, not only the electron beam of the electron microscope will fail to penetrate the object for successful imaging or experiment of electron diffraction, but also high-vacuum area, like electron beam gun, will lower its vacuum level or cause contamination therein, further damaging the microscope.

Limited to the vacuum environment, the conventional electron microscope could be operated for structural observation of solid substance inside the specimen chamber or for observation of dehydrated biological tissues only, like cells, bacteria, or viruses, neither for observation of any cell, bacterium, virus or the like having physiological functions under the fluid environment, absolutely nor for observation of biochemical reaction processes, like transcription between deoxyribonucleic acid (DNA) and ribonucleic acid (RNA) inside the nucleus and translation between RNA and protein, microtubules inside the cytoplast, and of any vital biological phenomenon, like physiology of transduction at neuromuscular junctions.

Therefore, there must be a device that the live cell or tissue could be put therein and the device could be put into the specimen chamber of the electron microscope for observation.

Although some people proposed an environment inside the electron microscope for observation, such as Gai P. L. (Gai P. L., Microscopy & Microanalysis 8, 21, 2002). However, such design has the following drawbacks. It failed to keep the pressure of the specimen chamber close to the normal pressure or higher for observation and analysis, because the liquid under the liquid-gas equilibrium will instantly fully volatilize, thus requiring supplementary liquid for entry into the specimen chamber. However, such entry of supplementary liquid will cause serious problems of flow or uneven admixture of new and original specimens to result in inauthenticity of the observation. Moreover, the massive volatilized high-pressure vapor or the high-pressure gas injected into the gas chamber from outside will fill the space between the upper and lower pole pieces to cause more serious multiple electron scattering due to electrons impinging excessive gasiform molecules, further disabling successful imaging of the electron beam or experiment of electron diffraction. Furthermore, the specimen chamber in design fails to effectively control the amount of the injected liquid, causing excessive thickness of the liquid to further disable penetration of the electron beam through the specimen and thus disabling observation and analysis.

In view of above, after successive trials and experiments, the present invention is finally invented to improve the aforementioned drawbacks of the prior art and to receive general specimen or live cells for observation under the microscope.

SUMMARY OF THE INVENTION

The primary objective of the present invention is to provide a semi-closed observational environment for an electron microscope; the semi-closed observational environment can be placed with a general specimen or live cell therein for observation under the microscope.

The secondary objective of the present invention is to provide a semi-closed observational environment for an electron microscope; the semi-closed observational environment is very thin to get rid of the limitation of narrow space between the two pole pieces of the high-resolution electron microscope and to be applied to the observation under the high-resolution electron microscope.

The third objective of the present invention is to provide a semi-closed observational environment for an electron microscope; while the semi-closed observational environment is injected with a liquid or gas therein, none of any vapor or liquid exhausts for production of a great amount of gas to enable more easy and clear observation under electron microscope.

The foregoing objectives of the present invention are attained by the semi-closed observational environment including a housing. The housing includes at least two spacers for partitioning an internal space thereof into a receiving chamber, a gas chamber located below the receiving chamber, and at least one buffer chamber located below the gas chamber. The receiving chamber has at least one view hole formed at a top side thereof and located at the housing, and at least one view hole formed at a bottom side thereof and located at one of the spacers for communication with the gas chamber. The gas chamber has at least one gas aperture formed at a bottom side thereof and located on the other spacer for communication with the buffer chamber. The buffer chamber has at least one outer aperture formed at a bottom side thereof and located at the housing for communication with outside. The two view holes of the receiving chamber are coaxially aligned with the gas and outer apertures. A film is mounted to and seals the view hole located at the top side of the receiving chamber. The housing has at least one gas inlet formed at a side of the gas chamber, and at least one pumping port formed at a side of the buffer chamber. Thus, the observational environment for the electron microscope can be attained and clear observational outcome can be still rendered.

The three preferred embodiments of the present invention as recited below, teaching that the films are mounted to the view hole, the gas aperture, and the outer aperture respectively, are semi-closed observational environment.

DETAILED DESCRIPTION OF PREFERRED EMBODIMENTS

Figure 1:
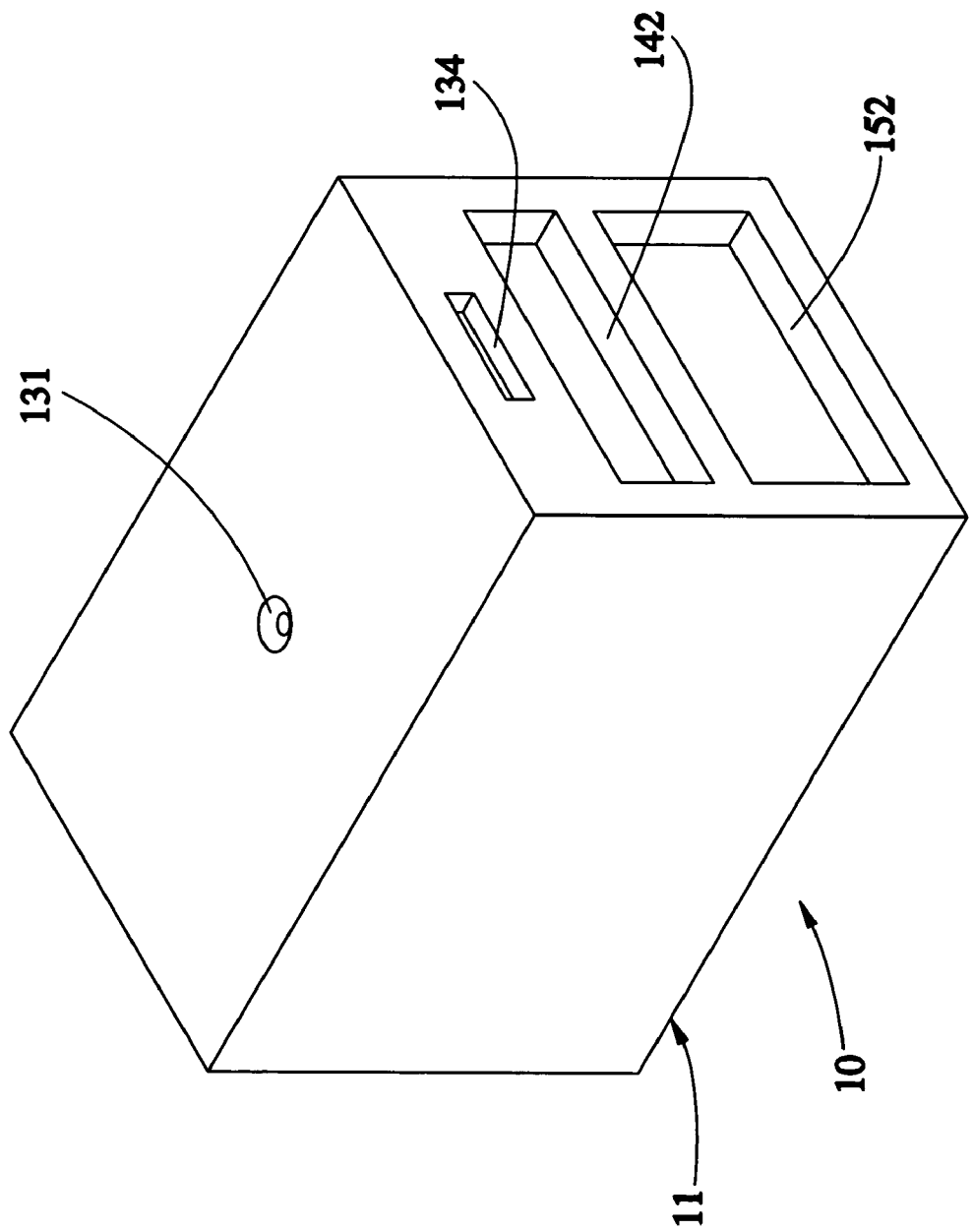
FIG. 1 is a perspective view of a first preferred embodiment of the present invention.

Referring to FIG. 1-3(A), a semi-closed observational environment 10 for an electron microscope according to a first preferred embodiment of the present invention includes a housing 11.

The housing 11 includes at least two spacers 12 mounted therein for partitioning an internal space thereof into a receiving chamber 13, a gas chamber 14 located below the receiving chamber 13, a buffer chamber 15 located below the gas chamber 14. The receiving chamber 13 has at least one view hole 131 formed at a top side thereof and located at the housing 11. The receiving chamber 13 further has at least one view hole 131 formed at a bottom side thereof and located at one of the two spacers 12 for communication with the gas chamber 14. The gas chamber 14 has at least one gas aperture 141 formed at a bottom side thereof and located at the other spacer 12 for communication with the buffer chamber 15. The buffer chamber 15 has at least one outer aperture 151 formed at a bottom side thereof and located at the housing 11 for communication with outside. The two view holes 131 of the receiving chamber 13 are coaxially aligned with the gas and outer apertures 141 and 151. Each of the view holes 131 has a diameter of 5-500 μm, wherein 50 μm is preferable. The view hole 131 located at the top side of the receiving chamber 13 is sealed with a film 132 mounted at an end thereof abutting the receiving chamber 13 and made of amorphous material, such as amorphous carbon film or preferably resilient polymeric film. The film 132 has a thickness of 20-100 nm and a plurality of strips 133 mounted to at least one end surface thereof. The strips 133 are intersected with one another to strengthen the film 132 and to further prevent the film 132 from rupture under one atmospheric pressure. The film 132 and the strips 133 can be made on the housing 11 in one piece by the conventional microlithography. For example, the strips can be formed on a sidewall of the housing having the view hole by means of microlithography to enable one-piece formation of the strips and the housing. The housing 11 has at least one gas inlet 142 formed at one side of the gas chamber 14, at least one pumping port 152 formed at one side of the buffer chamber 15, at least one inlet 134 formed at one side of the receiving chamber 13, and an outlet 135 formed at the other side of the receiving chamber 13.

Figure 3C:
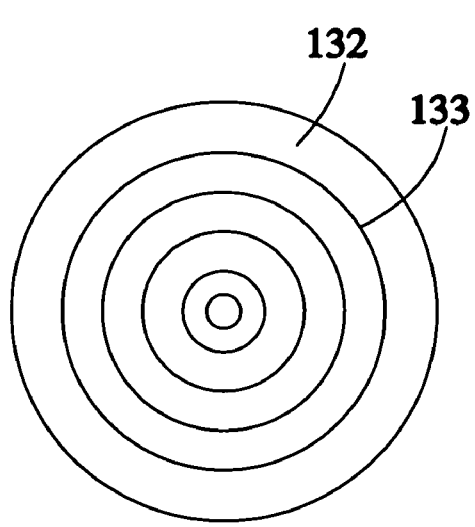
FIGS. 3(A), 3(B), 3(C), and 3(D) illustrate alternative structures of the film according to the first preferred embodiment of the present invention.
Figure 3A:
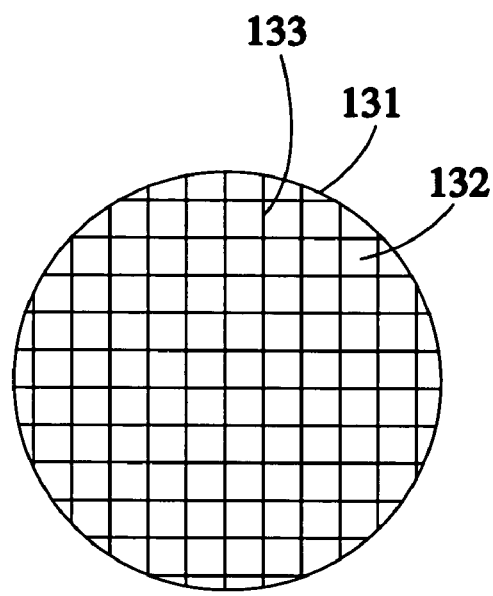
Figure 3D:
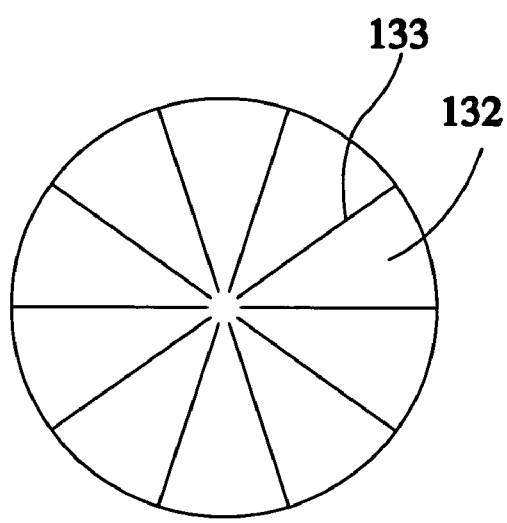
Figure 3B:
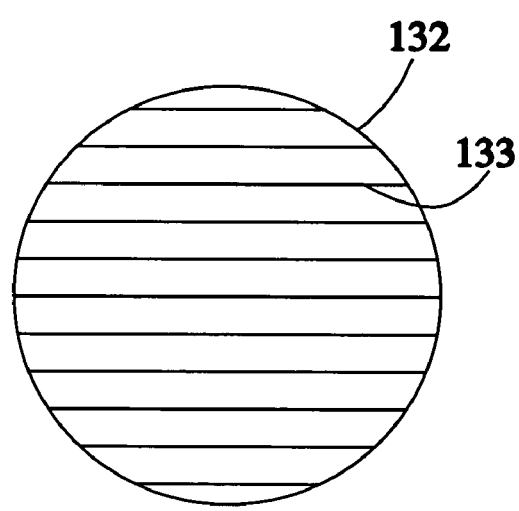

Each of the view holes 131 in the sectional view is taper-shaped to have a diameter decreasingly lessening toward the receiving chamber 13. Hydrophobic or super-hydrophobic treatment is applied to surfaces of sidewalls of the view holes 131 and the spacers 12. For example, prepare a plurality of pillars of each having a diameter of hundreds of nanometers. Each pillar is attached with a hydrophobic self-assembly monomolecular layer at a surface thereof to enable the contact angle of a water drop on the surface thereof to be larger than 150 degrees, thus being super-hydrophobic. While a specimen 99 is put into the semi-closed observational environment, the specimen 99, like a live cell, with liquid can be injected through the inlet 134 of the housing 11 into the receiving chamber 13 and the outlet 135 enables the injected liquid or vapor or gas to flow out thereof for pressure regulation. The liquid/specimen exhausting from the view holes 131 would be excluded by the super-hydrophobic surfaces of the spacers 12 and the sidewalls of the view holes 131 and flow out of the gas inlet 142 while the housing 131 stands upright. There is an alternative way for injecting the liquid/specimen. For example, to prevent the liquid/specimen from leaking from the view holes 131, in operation, provide the gas chamber 14 with a specific gas (like nitrogen, oxygen, carbon dioxide, inert gas, etc.) of a predetermined pressure and control difference between the pressure of the specific gas and the pressure of the injected liquid in the receiving chamber 13 to be smaller than or equal to the critical pressure of the liquid solution inside the receiving chamber 13 (Keller S. et al., Journal of Food Protection 66, 1260, 2003), such that the injected liquid/specimen can circulate inside the receiving chamber 13 without leaking from the view holes 131. While observation is intended, the circulation of the liquid inside the receiving chamber 13 can be stopped according to the experimental requirement. In addition, use the inlet 134 for pumping or injecting the liquid to control the amount and pressure of the liquid specimen. While the specimen 99 is a live cell, a nutrient fluid or vapor can be injected into the receiving chamber 13 and then the specimen 99 of the live cell can be fastened onto the film 132 or an internal sidewall of the receiving chamber 13 by a cell attachment agent, like poly-D-lysine, coated on the film 132 or the internal sidewall of the receiving chamber 13. In this embodiment, in addition to intersectional arrangement, the strips 133 can be alternatively disposed on the films 132 in parallel or concentric circle or radius as shown in FIGS. 3(B)-3(D), and the films 132 and the strips can be made by the conventional microlithography.

Figure 2:
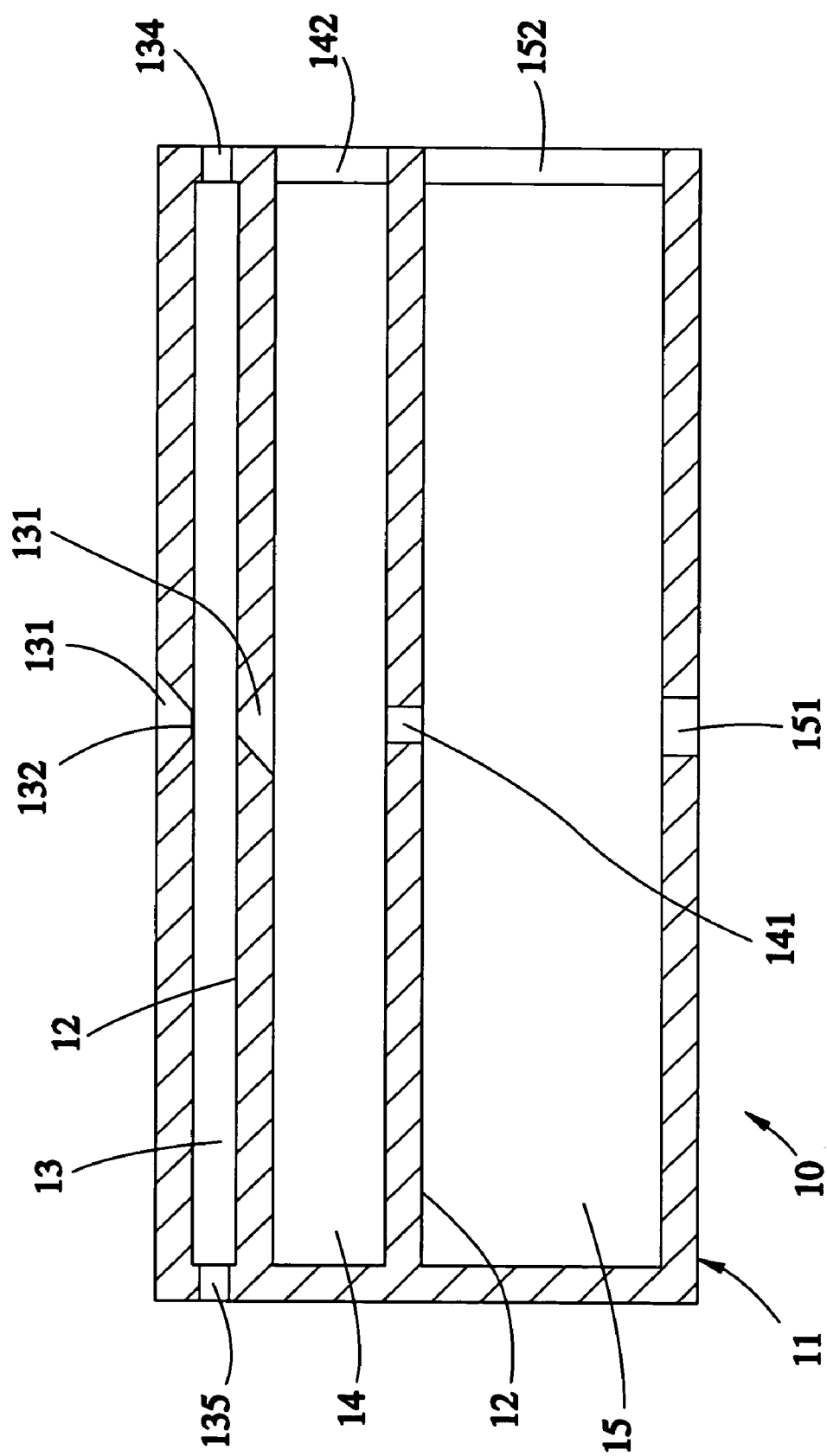
FIG. 2 is a sectional view of the first preferred embodiment of the present invention.
Figure 4:
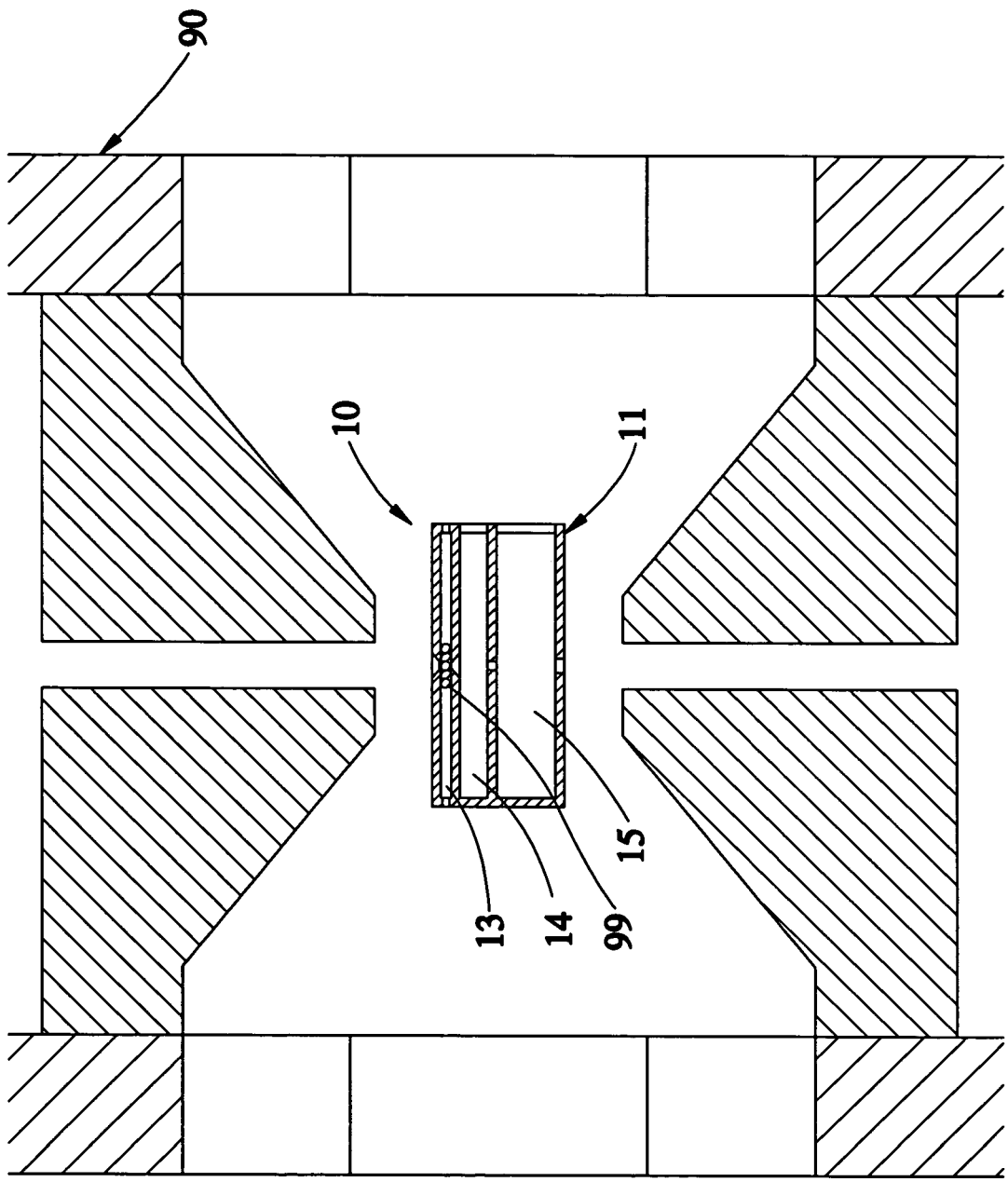
FIG. 4 is a schematic view of the first preferred embodiment of the present invention in cooperation with the electron microscope for observation.

While the observation is in process, as shown in FIG. 4 together with FIG. 2, the semi-closed observational environment 10 is put into the electron microscope 90. Because of its small thickness, such semi-closed observational environment 10 is not limited to the narrow interval between the two pole pieces of the high-resolution transmission electron microscope and can be applied to the observation under the high-resolution transmission electron microscope. Inject the liquid and the specimen 99 or the live cell through the inlet 134 into the receiving chamber 13 and supply the gas chamber 14 through the gas inlet 142 with vapor of predetermined pressure, e.g. an admixture of saturated/unsaturated water vapor and a specific gas of one atmospheric pressure in total; the specific gas can be nitrogen, oxygen, carbon dioxide, or an inert gas; the water vapor inside the gas chamber 14 can refrain the evaporation of the water inside the receiving chamber 13. Furthermore, it is alternative to supply the gas chamber 14 with a specific gas of one atmospheric pressure and to control difference between the pressure of the specific gas and the pressure of the water solution in the receiving chamber 13 to be smaller than or equal to the critical pressure that the water solution leaks out of the receiving chamber 13 (Keller S. et al., Journal of Food Protection 66, 1260, 2003), thus preventing the water solution from flowing out of the view hole 131 of the receiving chamber 13 and enabling the solution to merely volatilize through the view hole 131 into the gas chamber 14. Keep pumping the buffer chamber 15 to pump out the vapor and the gas exhausting from the gas chamber 14 into the buffer chamber 15 and to prevent them from exhausting out of the outer aperture 151. While the observation is in process, the electron beam (not shown) of the electron microscope 90 passes through the outer and gas apertures 151 and 141 and the view holes 131 to enable the observation of the specimen 99 (like the live cell) in the receiving chamber 13. The film 132 can prevent the liquid in the receiving chamber 13 from flowing out of the housing 11. The gas and the vapor in the buffer chamber 15 is pumped out through the pumping port 152 to avoid exhausting through the outer aperture 151 toward outside of the housing 11. Thus, the vacuum environment of the electron microscope 90 avoids destruction and the microscopic observation of the live cell 99 or other specimen can be done successfully.

Figure 5:
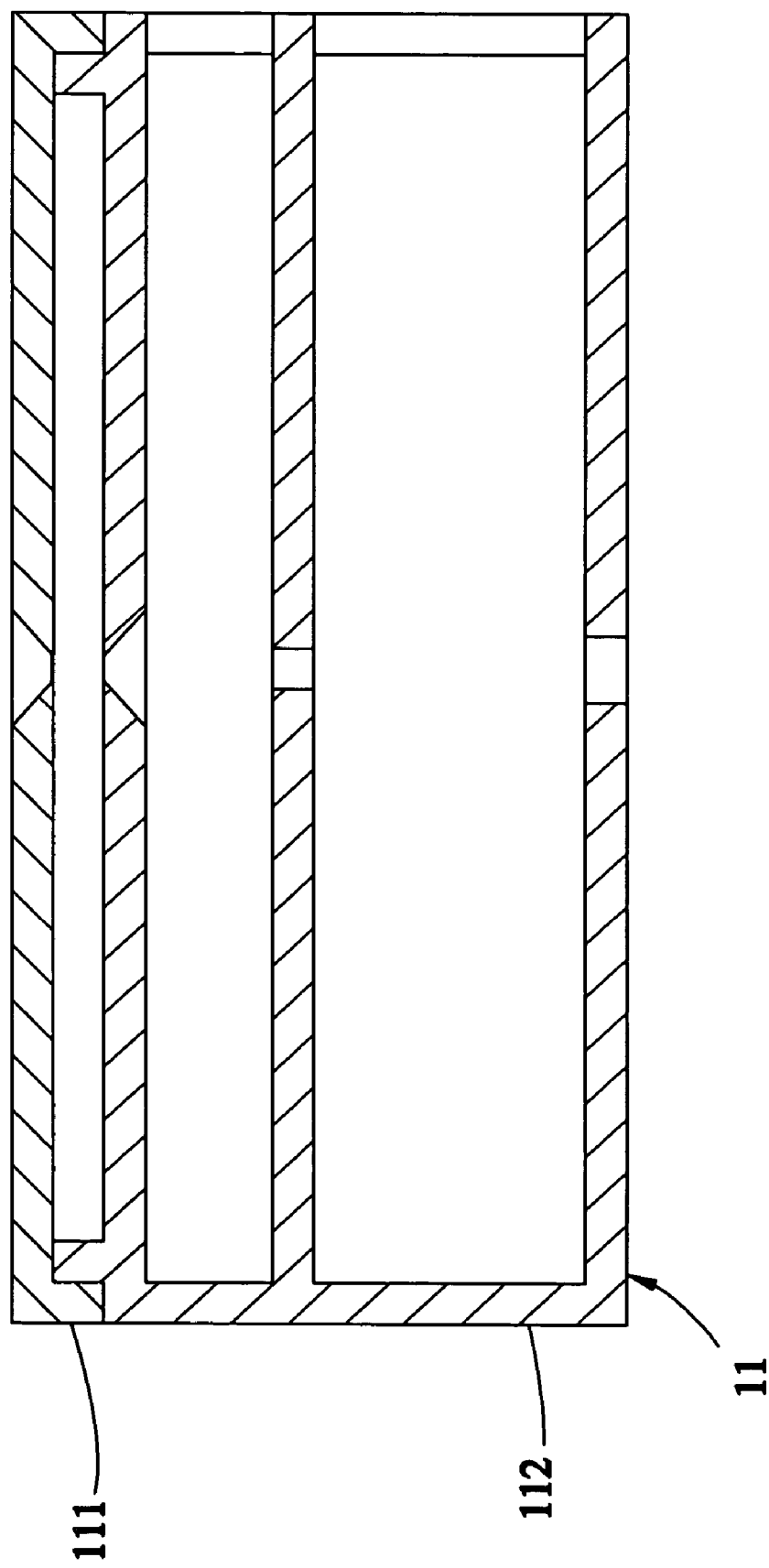
FIG. 5 is another sectional view of the first preferred embodiment of the present invention, showing that the housing is formed of a cover shell and a base shell combined together.

Alternatively, in addition to the one-piece formation shown in FIG. 2, the housing 11 can be formed of a cover shell 111 and a base shell 112, wherein the cover shell 111 and the base shell 112 are fastened together with an adhesive (not shown), as shown in FIG. 5.

Figure 6:
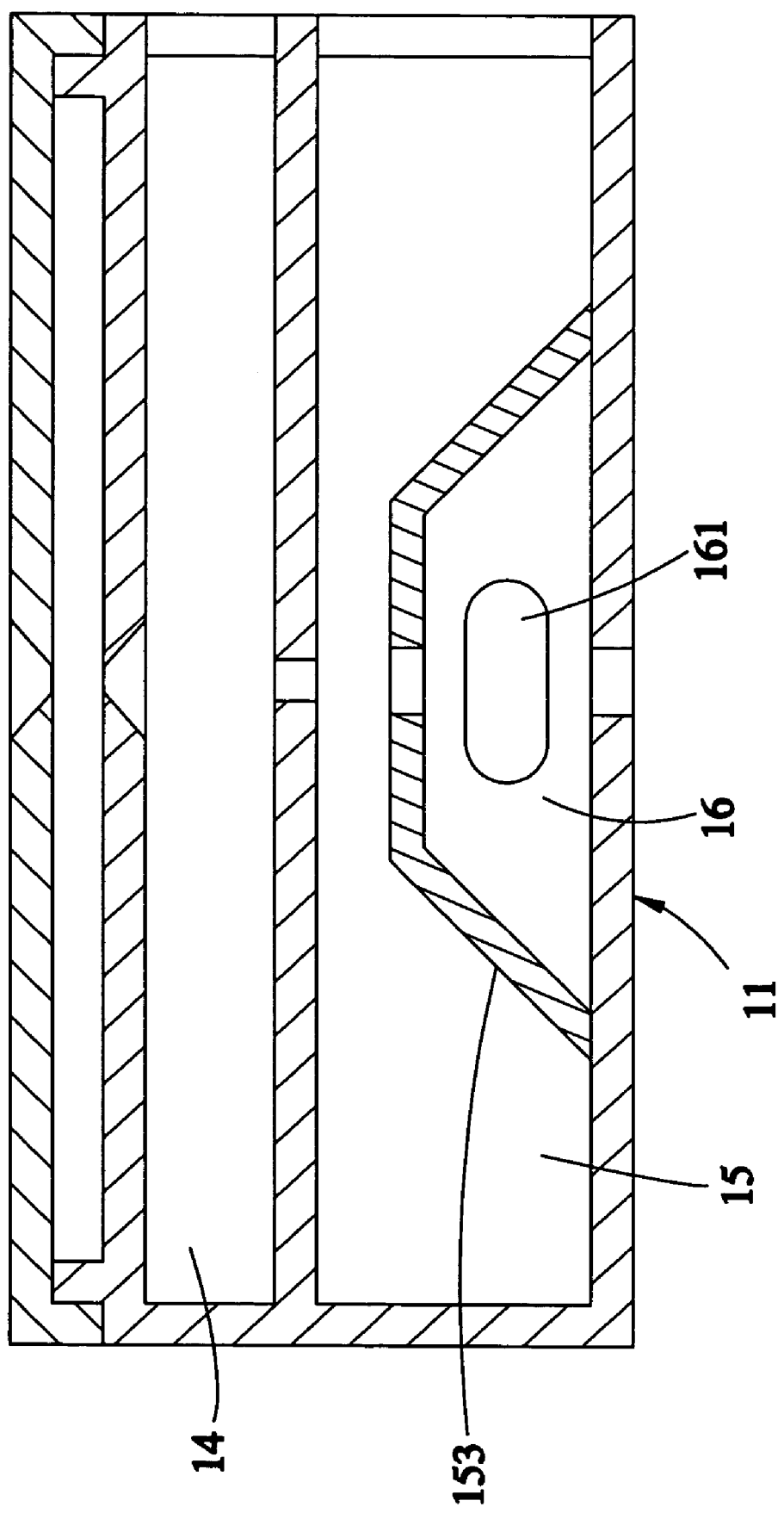
FIG. 6 is another sectional view of the first preferred embodiment of the present invention, showing that an inclined spacer is alternatively mounted in the housing.

In this embodiment, without thickening the housing 11, an inclined spacer 153 can be alternatively mounted in the buffer chamber 15, as shown in FIG. 6, to further partition off an internal space of the buffer chamber 15 to form an auxiliary buffer room 16 having a pumping port 161 formed laterally. The buffer chamber 15 and the auxiliary buffer room 16 can achieve multilayered depressurization to enable the pressure of the gas chamber 14 of the housing 11 to reach more than one atmospheric pressure for operation and to securely prevent the gas and the vapor from exhausting out of the housing 11.

Figure 7:
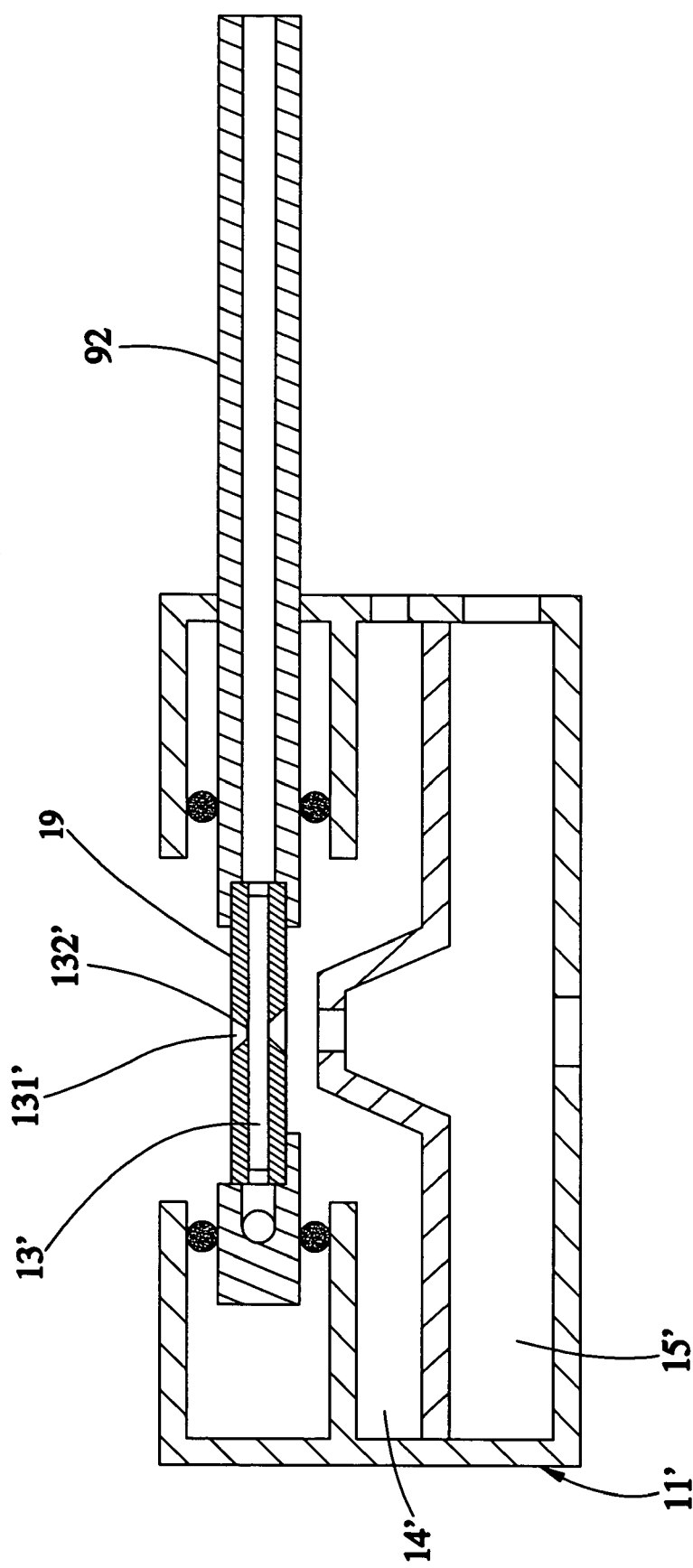
FIG. 7 is another sectional view of the first preferred embodiment of the present invention in cooperation with a specimen holder.

Referring to FIG. 7, the primary structure of the present invention can be combined with a specimen holder 92 together to enable the receiving, gas, and buffer chambers 13', 14', and 15' to be in cooperation with the specimen holder 92 for assembly. FIG. 7 shows the operational status of the first embodiment of the present invention in cooperation with the specimen holder 92, wherein a box-like member 19 having the receiving chamber 13' formed therein is mounted onto the specimen holder 92, and the box-like member 19 and the specimen holder 92 are integrally mounted inside the housing 11'; the view hole 131' at the receiving chamber 13' is mounted with the film 132'; the buffer and gas chambers 15' and 14' are formed in the housing 11'. The operational manner disclosed by FIG. 7 is equal to that of the aforementioned one, such that no further recitation is necessary.

Figure 8:
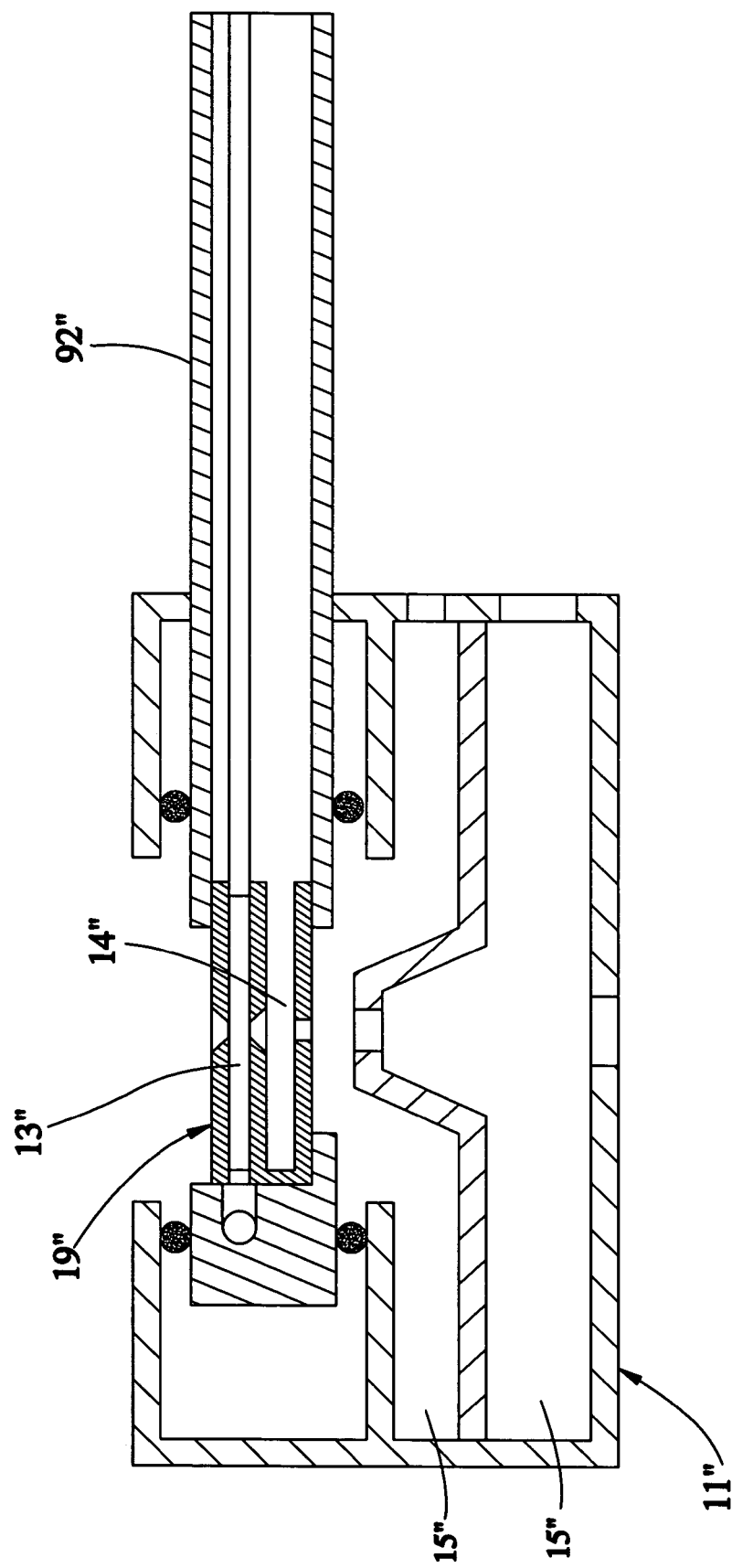
FIG. 8 is an alternative sectional view of the first preferred embodiment of the present invention in cooperation with the specimen holder.

FIG. 8 shows an alternative status of the first embodiment, similar to the aforementioned one, wherein a box-like member 19" having a receiving chamber 13" formed therein is mounted to a specimen holder 92" together with the gas chamber 14" and the specimen holder 92" is mounted inside the housing 11". The receiving and gas chambers 13" and 14" in the box-like member 19" can be made by the microlithography. Such microlithography can enable the gas chamber 14" to have an ultra-thin thickness to reduce the electron multiple scattering while the electron beam passes through the gas chamber. In such status, one more buffer chamber 15" than FIGS. 2 and 4 is formed, such that the gas pressure in the gas chamber 14" can be operated to be higher. FIG. 8 teaches a similar operation to the aforementioned one, and thus no further recitation is necessary.

Figure 9:
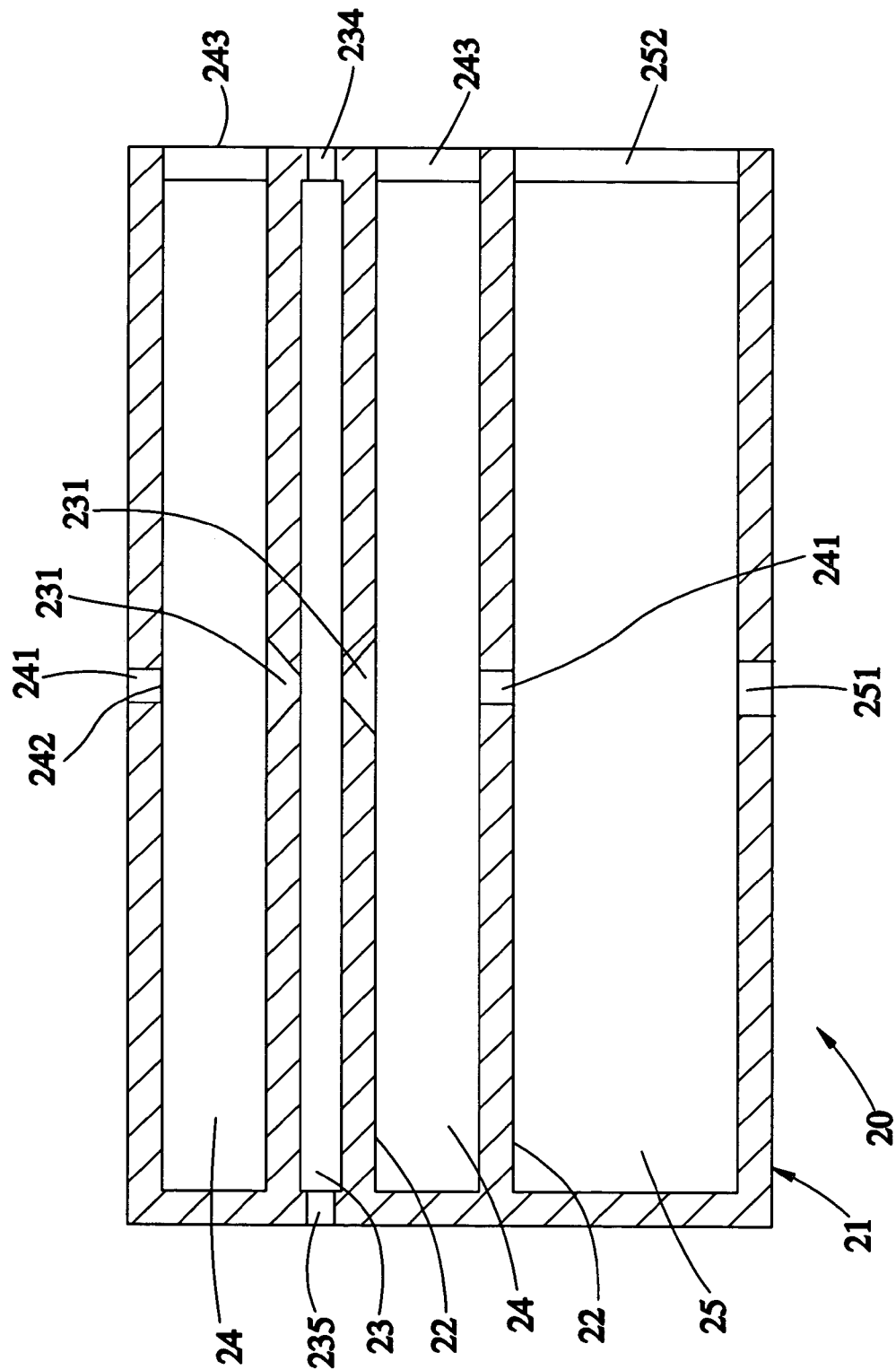
FIG. 9 is a sectional view of a second preferred embodiment of the present invention.

Referring to FIG. 9, a semi-closed observational environment 20 for the electron microscope according to a second preferred embodiment of the present invention includes a housing 21.

The housing 21 includes at least two spacers 22 formed therein for partitioning an internal space thereof into a receiving chamber 23, at least one gas chamber 24 covering upper and lower sides of the receiving chamber 23, and a buffer chamber 25 formed below the gas chamber 24 below the receiving chamber 23. The receiving chamber 23 has at least one view hole formed on each of a top side and a bottom side thereof and located on one of the spacers 22 for communication with the gas chamber 24. The gas chamber 24 has at least one gas aperture 241 formed at each of a top side thereof and a bottom side thereof and located at the other spacer 22 for communication with the buffer chamber 25. The buffer chamber 25 has at least one outer aperture 251 formed at a bottom side thereof and located at the housing 21 for communication with outside. The two view holes 231 are coaxially aligned with the two gas apertures 241 and the outer aperture 251. The gas aperture 241 located above the gas chamber 24 above the receiving chamber 23 is sealed with a film 242 mounted to an end thereof abutting the gas chamber 24. The housing 21 further includes at least one gas inlet 243 formed at one side of the gas chamber 24, at least one pumping port 252 formed at one side of the buffer chamber 25, an inlet 234 formed at one side of the receiving chamber 23, and an outlet 235 formed at the other side of the receiving chamber 23.

Figure 10:
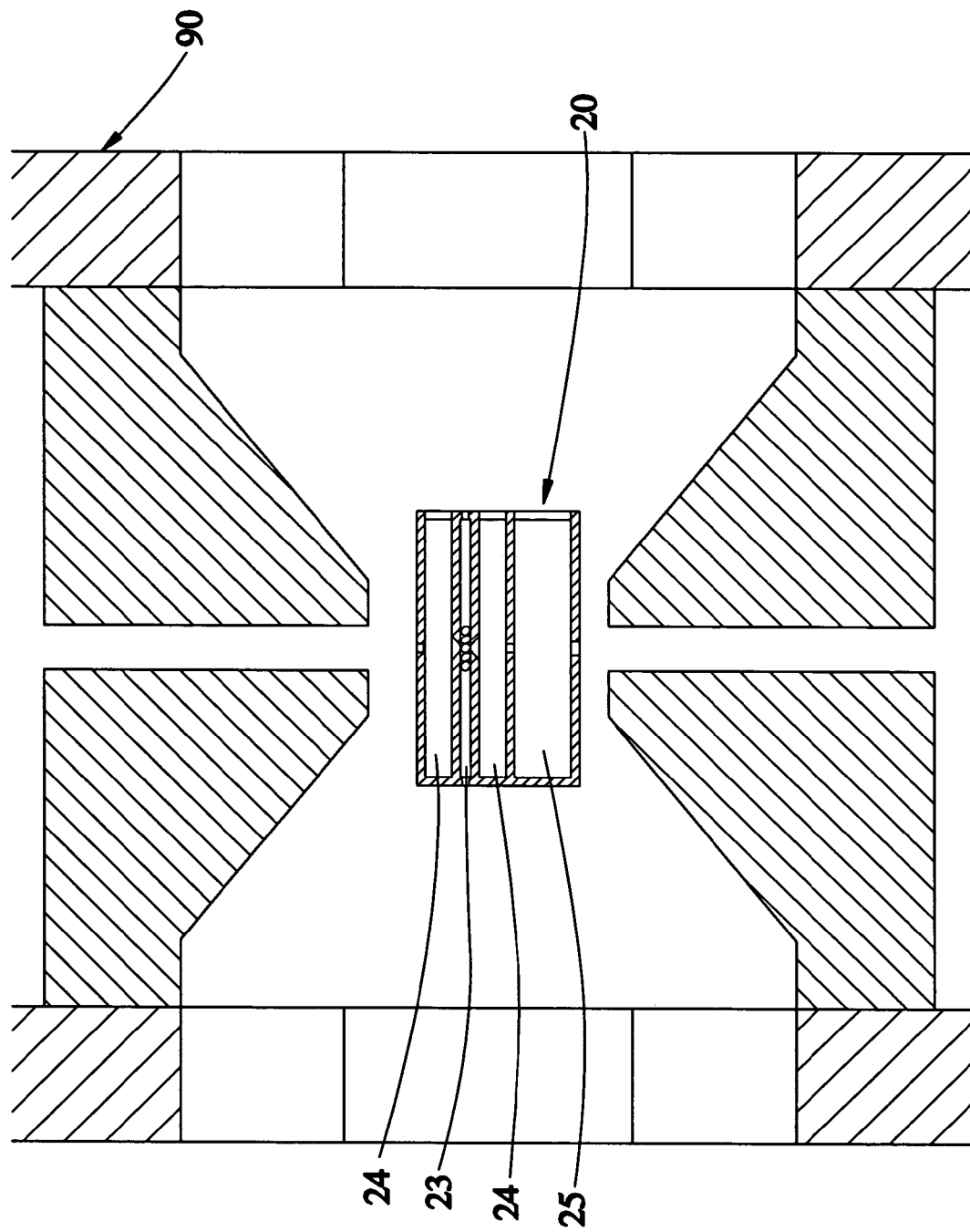
FIG. 10 is a schematic view of the second preferred embodiment of the present invention in cooperation with the electron microscope for observation.

While in operation, referring to FIG. 10 together with FIG. 9, the status of the second embodiment of the present invention put into the electron microscope 90 is similar to the that of the first embodiment and the operational statuses of the two embodiments are also similar, but having difference as follows: The second embodiment has one more gas chamber 24 located above the receiving chamber 23 than the first embodiment and the film 242 is mounted to the gas aperture 241 on the top side of the gas chamber 24. The operations of the receiving, gas, and buffer chambers 23, 24, and 25 of the second embodiment are the same as those of the first embodiment, and thus it is not necessary to describe the operations of the second embodiment more.

In the second embodiment, without thickening the housing 21, an inclined spacer (not shown) can be alternatively mounted in the buffer chamber 25 with the same manner shown in FIG. 6 for partitioning off the buffer chamber 25 to make an auxiliary room (not shown). Thus, the multilayered depressurization can be achieved to enable the pressure of the gas chamber 24 of the housing 21 to reach more than one atmospheric pressure for operation.

Figure 11:
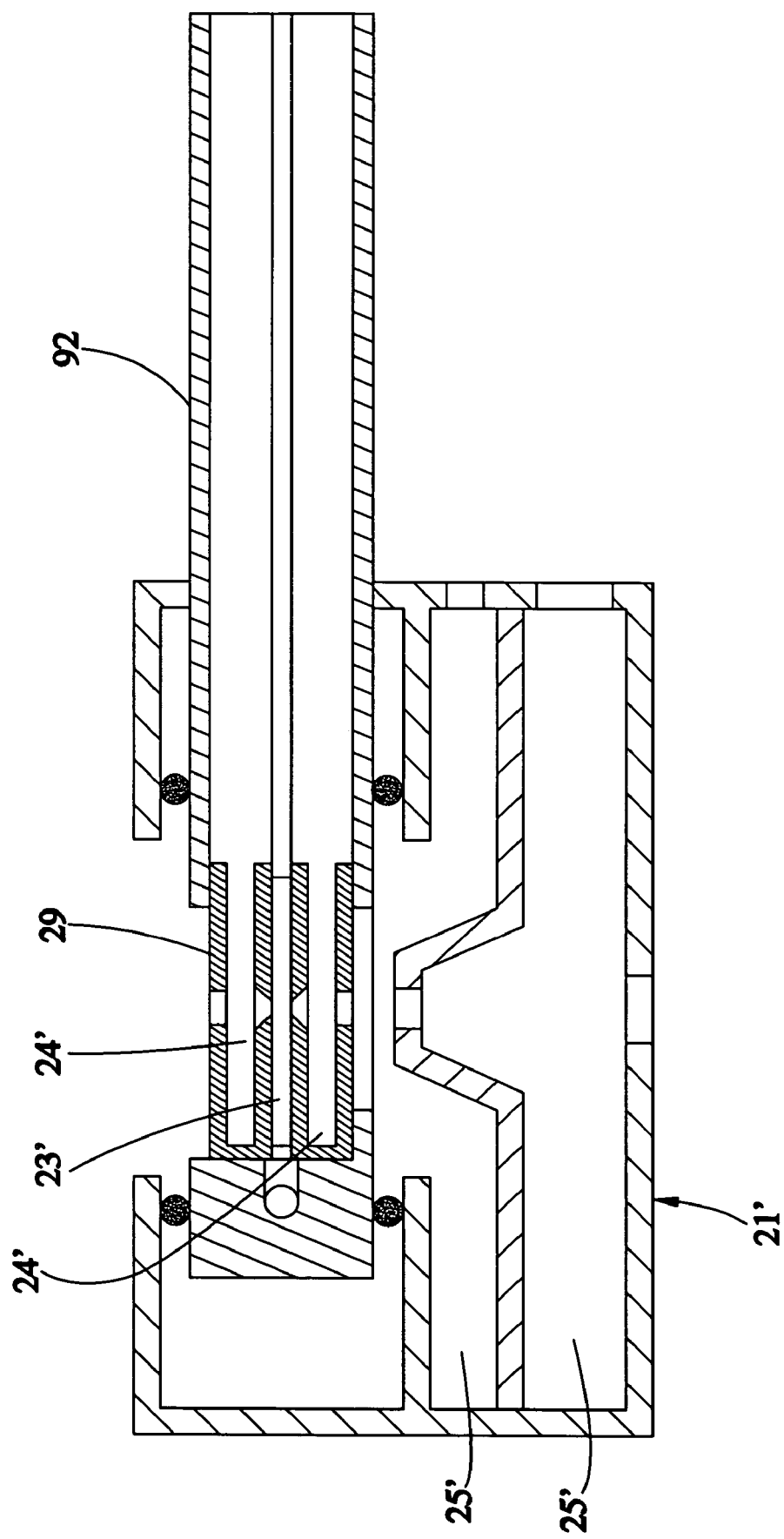
FIG. 11 is another sectional view of the second preferred embodiment of the present invention in cooperation with a specimen holder.

Referring to FIG. 11, the primary structure of the present invention can be alternatively combined with the specimen holder 92. A box-like member 29 is formed of a receiving chamber 23' and a gas chamber 24', for combination with the specimen holder 92. The housing 21' cooperates with the specimen holder 92 to form two buffer chambers 25. Accordingly, a similar structure to that of FIG. 9 is formed and can be operated in the same manner as FIG. 7. In addition, the structure shown in FIG. 11 has one more buffer chamber than that of FIG. 7 to enable the pressure of the gas chamber 24' of the box-like member 29 to reach more than one atmospheric pressure for operation.

Figure 12:
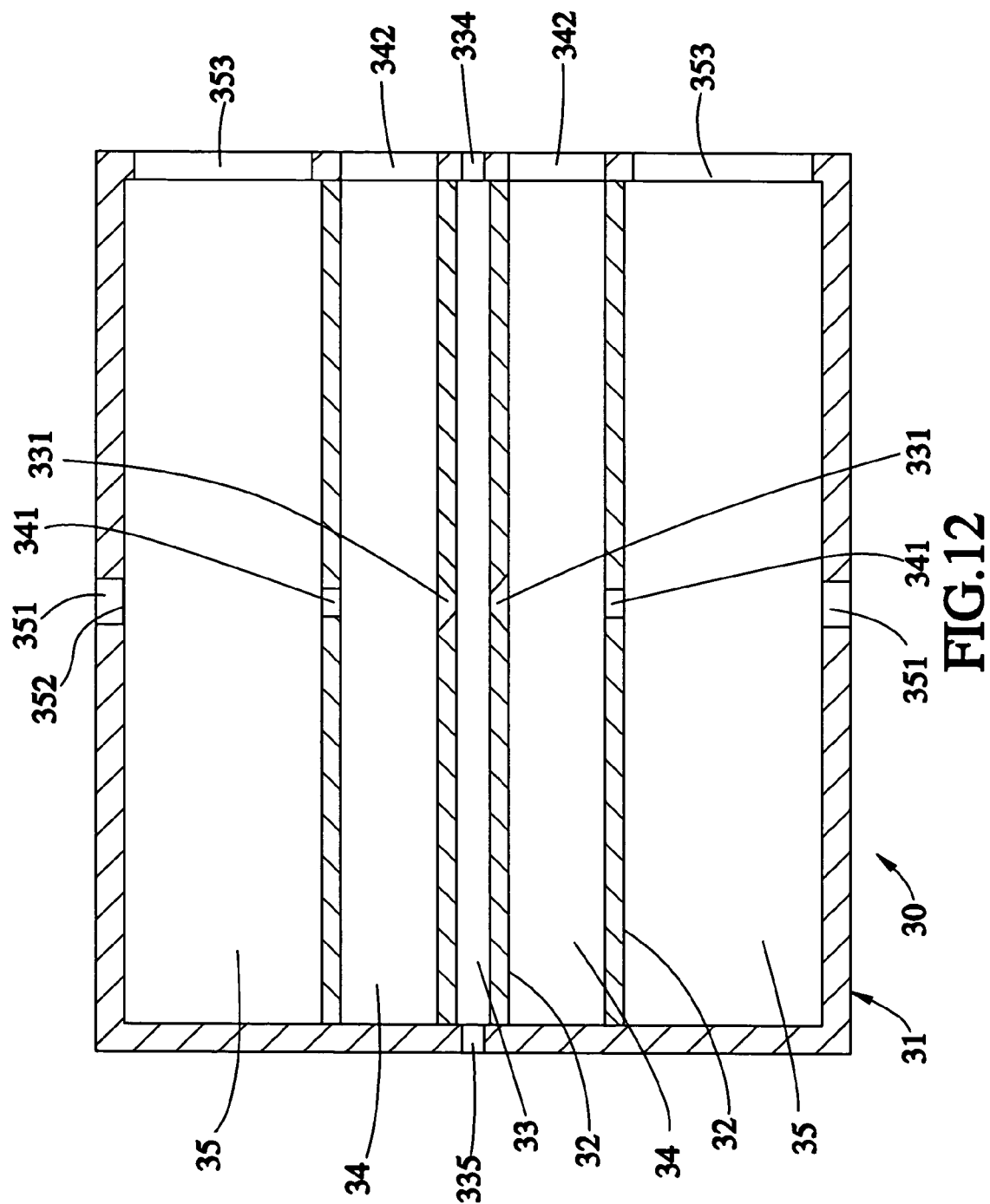
FIG. 12 is a sectional view of a third preferred embodiment of the present invention.

Referring to FIG. 12, a semi-closed environment 30 for the electron microscope according to a third preferred embodiment of the present invention includes a housing 31. The housing 31 includes at least two spacers 32 formed therein for partitioning an internal space thereof into a receiving chamber 33, at least one gas chamber 34 covering upper and lower sides the receiving chamber 33, and at least one buffer chamber 35 covering upper and lower sides of the gas chamber 34. The receiving chamber 33 has at least one view hole 331 formed at each of a top side and a bottom side thereof and located on one of the spacers 32 for communication with the gas chamber 34. The gas chamber 34 has at least one gas aperture 341 formed at each of a top side and a bottom side thereof and located at the other spacer 32 for communication with the buffer chamber 35. The buffer chamber 35 has at least one outer aperture 351 formed at each of a top side and a bottom side thereof and located at the housing 31 for communication with outside. The two view holes 331 are coaxially aligned with the two gas apertures 341 and the two outer apertures 351. The outer aperture 351 located above the buffer chamber 35 is sealed with a film 352 mounted an end thereof abutting the buffer chamber 35. The hosing 31 further includes at least one gas inlet 342 formed at one side of each of the gas chambers 34, at least one pumping port 353 formed at each of one side of the buffer chambers 35, an inlet 334 formed at one side the receiving chamber 33, and an outlet 335 formed at the other side of the receiving chamber 33.

Figure 13:
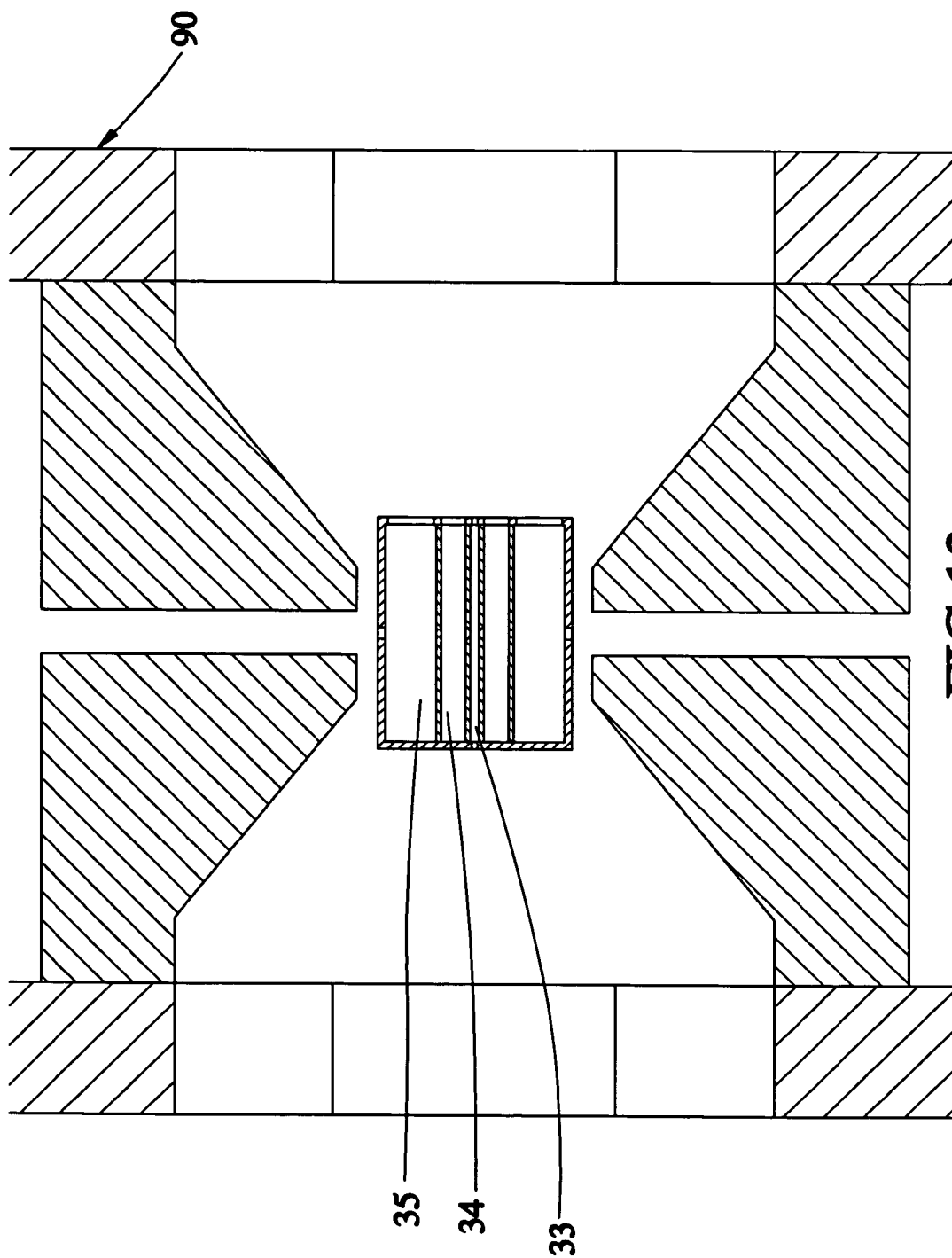
FIG. 13 is a schematic view of the third preferred embodiment of the present invention in cooperation with the electron microscope for observation.

In operation of the third embodiment, as shown in FIG. 13, the status of the housing 31 put into the electron microscope 90 is similar to the second embodiment and the operation status is also similar to the first embodiment. The difference between the second and third embodiments lies in that there is one more buffer chamber 35 located above the gas chamber 34 in the third embodiment and the film 352 is mounted to the outer aperture 351 located at the buffer chamber 35 above the gas chamber 34. The operations of the receiving, gas, and buffer chambers 33, 34, and 35 are the same as those of the first embodiment and thus no more description is necessary.

Without thickening the housing 31, an inclined spacer (not shown) can be alternatively mounted in the buffer chamber 35 in the manner indicated in FIG. 6 for partitioning off the buffer chamber 35 to further make an auxiliary buffer chamber (not shown), enabling the housing 31 to have more buffer chambers to achieve the multilayered depressurization. Thus, the pressure inside the gas chamber of the housing can be higher for operation.

Figure 14:
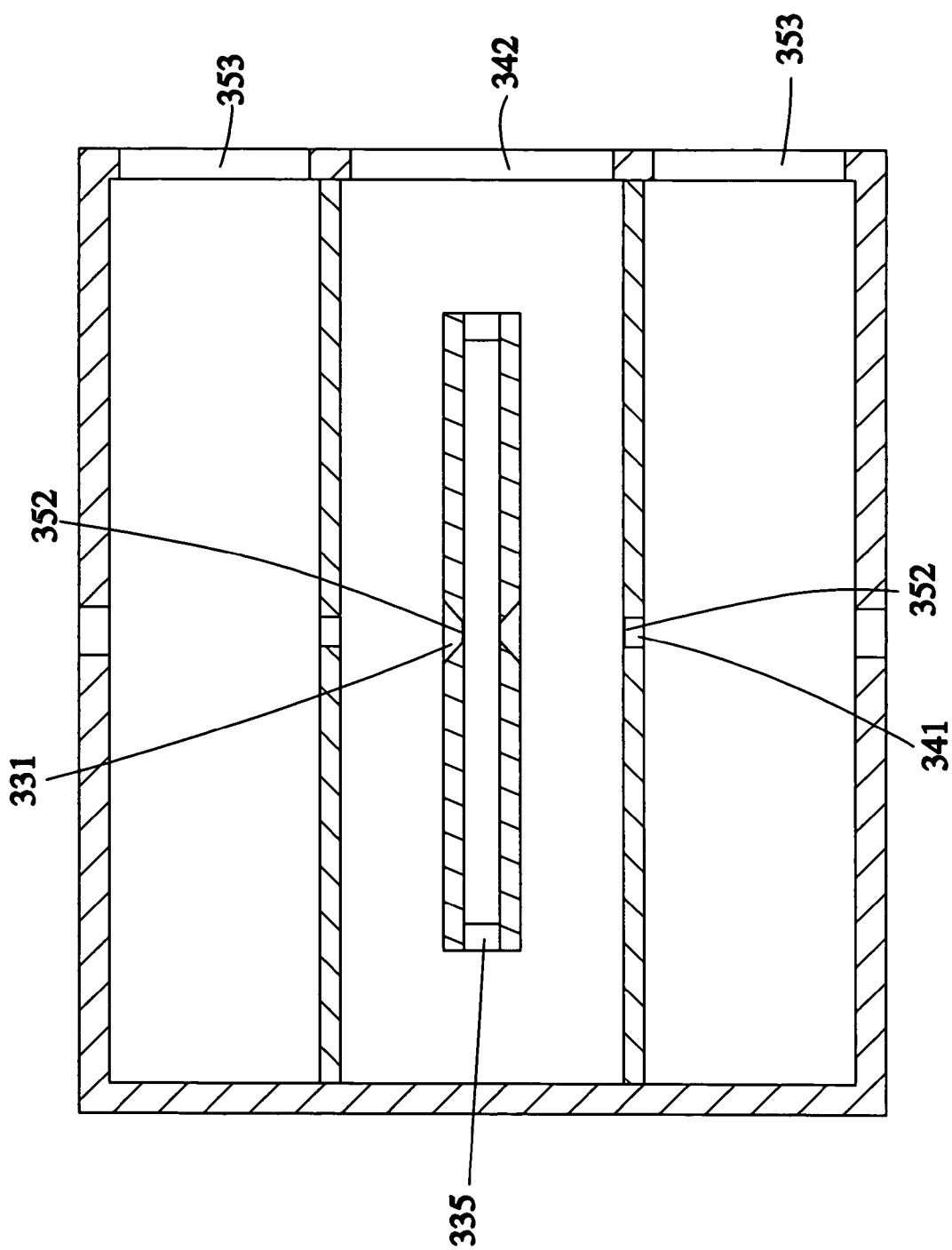
FIG. 14 is another sectional view of the third preferred embodiment of the present invention, showing that the films are mounted at different positions.

Although the aforementioned three embodiments of the present invention disclose alternative locations of the film, they are for example only and not intended to limit the scope of the claim of the present invention. Taking FIGS. 12 in connection with the third embodiment for example, the film can be mounted to one of the outer apertures, or alternatively to one of the view holes and the gas apertures, or alternatively each of two or all of the view holes, the gas apertures, and the outer apertures, or alternatively to the lower side of the housing in addition to the upper side of the housing. Referring to FIG. 14 in cooperation with the third embodiment, the film 352 can be alternatively mounted to the upper view hole 331 and the lower gas aperture 341 to have the same semi-closed effect to reach the same effects and same operational manners with those illustrated in previous embodiments.

In the aforementioned embodiments, the location of the film is for example only and is not limited to adjacency to an end of one of the receiving, gas, and buffer chambers but equivalent changes and modifications may be made within the scope of the appended claims.

In addition, in the aforementioned embodiments, the receiving chamber can receive the specimen of the live cell which can be fixed to the internal sidewall of the chamber or alternatively fixed to the film mounted on one of the view holes as mentioned in the first embodiment. The specimen can be fastened onto the film or the internal sidewall of the chamber by a cell attachment agent, like poly-D-lysine, coated on the film and the internal sidewall of the receiving chamber.

The advantages of the prevent invention are as follows:

1. Providing an environment for the microscopic observation of the specimen or live cell: The present invention enables the general specimen or the live cell to be put into the receiving chamber for the observation under the electron microscope, thus overcoming the problem of the prior art which fails to observe the live cell.

2. No damage to the electron microscope: While the liquid or the gas is injected into the receiving chamber, the buffer chambers can do the depressurization to pump out the vapor from the buffer chamber and to prevent the vapor from escaping out of the housing. Thus, the present invention enables the microscopic observation to be more easy and clear without damage to the electron microscope.

3. Because the semi-closed housing of the present invention is very thin, the narrow interval between the two pole pieces of the high-resolution transmission electron microscope is not a restriction.

Although the present invention has been described with respect to specific preferred embodiments thereof, it is no way limited to the details of the illustrated structures but changes and modifications may be made within the scope of the appended claims.

What is claimed is:

1. A semi-closed environment for an electron microscope, comprising:

a housing having at least two spacers for partitioning its internal space into a receiving chamber, a gas chamber located below said receiving chamber, and at least one buffer chamber located below said gas chamber, said receiving chamber having at least one view hole formed at a top side thereof and located at said housing, said receiving chamber further having at least one view hole formed at a bottom side thereof and located at one of said at least two spacers for communication with said gas chamber, said gas chamber having at least one gas aperture formed at a bottom side thereof and located at the other spacer for communication with said buffer chamber, said buffer chamber having at least one outer aperture formed at a bottom side thereof for communication with outside, said at least two view holes being coaxially aligned with said at least one gas aperture and said at least one outer aperture, said housing further having a film mounted to and sealing said view hole located at the top side of said receiving chamber, at least one gas inlet formed at a side of said gas chamber, and at least one pumping port formed at a side of said buffer chamber.

2. The semi-closed environment as defined in claim 1, wherein each of said at least two view holes has a diameter of 5-500 µm.

3. The semi-closed environment as defined in claim 1, wherein said film is mounted to an end of said view hole abutting said receiving chamber.

4. The semi-closed environment as defined in claim 3, wherein said film has a plurality of strips located at at least one end surface thereof.

5. The semi-closed environment as defined in claim 4, wherein said strips are disposed on said film in parallel or intersection or concentric circle or radius.

6. The semi-closed environment as defined in claim 3, wherein said film is formed on said housing in one piece by means of microlithography.

7. The semi-closed environment as defined in claim 6, wherein said strips and said film are formed in one piece.

8. The semi-closed environment as defined in claim 1, wherein said housing further comprises an inlet and an outlet formed at two sides of said receiving chamber respectively.

9. A semi-closed environment for an electron microscope, comprising:
a housing having at least two spacers for partitioning its internal space into a receiving chamber, at least one gas chamber covering upper and lower sides of said receiving chamber, and at least one buffer chamber located below said gas chamber, said receiving chamber having at least one view hole formed at each of a top side thereof and a bottom side thereof and located at one of said at least two spacers for communication with said gas chamber, said gas chamber having at least one gas aperture formed at each of a top side thereof and a bottom side thereof and located at the other spacer for communication with said buffer chamber, said buffer chamber having at least one outer aperture formed at a bottom side thereof and located at said housing for communication with outside, said at least two view holes being coaxially aligned with said at least two gas apertures and said at least one outer aperture, said housing further having a film mounted to and sealing said gas aperture located above the other, at least one gas inlet formed at one side of said gas chamber, and at least one pumping port formed at one side of said buffer chamber.

10. The semi-closed environment as defined in claim 9, wherein said film is mounted to an end of said gas aperture abutting said gas chamber.

11. The semi-closed environment as defined in claim 9, wherein said housing further comprises an inlet and an outlet formed at two sides of said receiving chamber respectively.

12. A semi-closed environment for an electron microscope, comprising:
a housing having at least two spacers for partitioning its internal space into a receiving chamber, at least one gas chamber covering upper and lower sides of said receiving chamber, and at least one buffer chamber covering upper and lower sides of said gas chamber, said receiving chamber having at least one view hole formed at each of a top side thereof and a bottom side thereof and located at one of said at least two spacers for communication with said gas chamber, said gas chamber having at least one gas aperture formed at each of a top side thereof and a bottom side thereof and located at the other spacer for communication with said buffer chamber, said buffer chamber having at least one outer aperture formed at each of a top side thereof and a bottom side thereof and located at said housing for communication with outside, said at least two view holes, said at least two gas apertures, and said at least two outer apertures being coaxially aligned, said housing further having a film mounted to and sealing said outer aperture located above the other, at least one gas inlet formed at one side of said gas chamber, and at least one pumping port formed at one side of said buffer chamber.

13. The semi-closed environment as defined in claim 12, wherein said film is mounted to an end of said outer aperture abutting said buffer chamber.

14. The semi-closed environment as defined in claim 12, wherein said housing further comprises an inlet and outlet formed at two sides of said receiving chamber respectively.

* * * * *